United States Patent
Cusin et al.

(10) Patent No.: US 11,454,886 B2
(45) Date of Patent: Sep. 27, 2022

(54) METHOD FOR MANUFACTURING A HOROLOGICAL COMPONENT AND COMPONENT OBTAINED ACCORDING TO THIS METHOD

(71) Applicant: Nivarox-FAR S.A., Le Locle (CH)

(72) Inventors: Pierre Cusin, Villars-Burquin (CH); Alex Gandelhman, Neuchatel (CH); Michel Musy, Orpund (CH); Clare Golfier, La Neuveville (CH)

(73) Assignee: Nivarox-FAR S.A., Le Locle (CH)

( * ) Notice: Subject to any disclaimer, the term of this patent is extended or adjusted under 35 U.S.C. 154(b) by 0 days.

(21) Appl. No.: 17/080,984

(22) Filed: Oct. 27, 2020

(65) Prior Publication Data
US 2021/0191258 A1 Jun. 24, 2021

(30) Foreign Application Priority Data
Dec. 18, 2019 (EP) .................... 19217372

(51) Int. Cl.
| | |
|---|---|
| *B29C 70/34* | (2006.01) |
| *C25D 1/10* | (2006.01) |
| *G04B 15/14* | (2006.01) |
| *G03F 7/00* | (2006.01) |
| *C25D 1/00* | (2006.01) |
| *B29L 31/00* | (2006.01) |

(52) U.S. Cl.
CPC ............ *G03F 7/0002* (2013.01); *B29C 70/34* (2013.01); *C25D 1/003* (2013.01); *G04B 15/14* (2013.01); *B29L 2031/739* (2013.01)

(58) Field of Classification Search
None
See application file for complete search history.

(56) References Cited

U.S. PATENT DOCUMENTS

| | | | | |
|---|---|---|---|---|
| 4,696,878 | A | * 9/1987 | Shimkunas | ............... G03F 1/22 378/35 |
| 5,685,062 | A | * 11/1997 | McCarthy | ............ H02K 37/125 29/424 |
| 2006/0261518 | A1 | 11/2006 | Willson et al. | |

(Continued)

FOREIGN PATENT DOCUMENTS

| | | |
|---|---|---|
| EP | 2 157 476 A1 | 2/2010 |
| EP | 2 405 301 A1 | 1/2012 |
| EP | 3 266 905 A | 1/2018 |

(Continued)

OTHER PUBLICATIONS

Bacher et al. "The LIGA Technique and its Potential for Microsystems—A Survey," IEEE Transactions on Industrial Electronics, vol. 42, No. 5, Oct. 1, 1995, 11 pages. (Year: 1995).*

(Continued)

*Primary Examiner* — Alexander M Weddle
(74) *Attorney, Agent, or Firm* — Oblon, McClelland, Maier & Neustadt, L.L.P.

(57) ABSTRACT

A method for manufacturing metallic horological components includes the steps of forming a LIGA-UV type method a multi-level photosensitive resin mould and of galvanically depositing a layer of at least one metal using at least two conductive layers to form a block substantially reaching the top surface of the photosensitive resin.

14 Claims, 1 Drawing Sheet

(56) References Cited

U.S. PATENT DOCUMENTS

2019/0262896 A1* 8/2019 Carozzani ................ B22C 9/02

FOREIGN PATENT DOCUMENTS

| | | |
|---|---|---|
| EP | 2 053 146 A1 | 4/2019 |
| JP | 9-260258 A | 10/1997 |
| JP | 2006-161138 A | 6/2006 |
| JP | 2006-299371 A | 11/2006 |
| JP | 2015-25711 A | 2/2015 |
| JP | 2016-138876 A | 8/2016 |
| KR | 10-2011-0042121 | 4/2011 |
| WO | WO 2013/182615 A1 | 12/2013 |
| WO | WO-2017084807 A1 * | 5/2017 ............ B22D 25/026 |

OTHER PUBLICATIONS

European Search Report dated Jun. 19, 2020 in European Application 19217372.2 filed Dec. 18, 2019 (with English Translation of Categories of Cited Documents), 4 pages.

Bacher, W. et al., "The Liga Technique and Its Potential for Microsystems—A Survey," IEEE Transactions on Industrial Electronics, vol. 42, No. 5, Oct. 1, 1995, 11 pages.

Japanese Office Action dated Dec. 26, 2021 in Japanese Patent Application No. 2020-187764 (with English translation only), 11 pages.

Indian Office Action dated Jul. 6, 2021 in Indian Patent Application No. 202044054269, 5 pages.

Korean Office ActIon dated Jul. 8, 2022, issued in Korean Patent Application No. 10-2020-0169685 (with English translation).

* cited by examiner

METHOD FOR MANUFACTURING A HOROLOGICAL COMPONENT AND COMPONENT OBTAINED ACCORDING TO THIS METHOD

CROSS-REFERENCE TO RELATED APPLICATION

This application claims priority to European Patent Application No. 19217372.2 filed on Dec. 18, 2019, the entire disclosure of which is hereby incorporated herein by reference.

FIELD OF THE INVENTION

The present invention relates to a method for manufacturing a multi-level complex metallic structure by means of LIGA technology. The invention also relates to such a metallic structure, particularly horological components, obtained with this method.

BACKGROUND OF THE INVENTION

Methods corresponding to the above definition are already known. In particular, the article by A. B. Frazier et al. entitled "Metallic Microstuctures Fabricated Using Photosensitive Polyimide Electroplating molds" and published in the Journal of Microelectromechanical systems (Vol. 2, N deg. 2, Jun. 1993) describes a method for manufacturing multi-level metallic structures by galvanic growth in polyimide moulds produced by photolithography of layers of photosensitive resin. This method comprises the following steps:
creating on a substrate a sacrificial metallic layer and a priming layer for a subsequent galvanic growth step,
spreading a layer of photosensitive polyimide,
irradiating the polyimide layer with UV radiation through a mask corresponding to the contour of a level of the structure to be obtained,
developing the polyimide layer by dissolving the non-irradiated parts so as to obtain a polyimide mould,
filling the mould with nickel up to the height thereof by galvanic growth, and obtaining a substantially planar top surface,
depositing a thin layer of chromium over the entire top surface by vacuum evaporation,
depositing on the chromium layer a new layer of photosensitive resin,
irradiating the layer of resin through a new mask corresponding to the contour of the next level of the structure to be obtained,
developing the polyimide layer so as to obtain a new mould,
filling the new mould with nickel up to the height thereof by galvanic growth.
separating the multi-level structure and the polyimide mould from the sacrificial layer and the substrate,
separating the multi-level structure from the polyimide mould.

It will be understood that the method described above can, in principle, be implemented iteratively to obtain metallic structures having more than two layers.

The patent document WO2010/020515A1 describes the manufacturing of a part with several levels by producing a complete photoresist mould corresponding to the final part to be obtained before the galvanic deposition step of the metal of the part in the mould. Only multi-level parts wherein the level projections are included in one another can be produced using this method.

From the patent document EP2405301A1, a photoresist mould comprising at least two levels is also known, the levels formed in the substrate only including vertical and smooth flanks.

These methods only allow the manufacture of parts wherein the basic geometries are cylindrical, and do not allow the manufacture of parts comprising complex geometries such as bevelling or chamfers.

SUMMARY OF THE INVENTION

The aim of the present invention is that of remedying the above-mentioned drawbacks as well as others by providing a method for manufacturing multi-level metallic horological components, by combining a hot stamping step with LIGA technology, wherein a conductive layer is associated with a layer of resin for each level to enable reliable galvanic growth in the case of multi-level components.

The aim of the present invention is also that of enabling the manufacture of timepieces having complex geometries ordinarily not feasible via LIGA technology.

For this purpose, the invention relates to a method for manufacturing a horological component comprising the following steps:
a) providing the substrate, depositing a first electrically conductive layer thereon, and applying a first layer of photosensitive resin;
b) performing hot stamping via a buffer of the first layer of resin, by pressing the buffer up to a predefined distance from the substrate so as to retain a layer of resin, to shape the first layer of resin and define a first level of the horological component;
c) irradiating the first layer of resin shaped through a mask defining a first level of the component and dissolving the non-irradiated zones of the layer of photosensitive resin to reveal in places the first electrically conductive layer and form a mould comprising a first and a second level;
d) depositing a metallic layer by electroforming in the mould from the first conductive layer to form the component, the layer substantially reaching the top surface of the second layer of photosensitive resin;
e) successively removing the substrate, the first conductive layer and the resin to release the component.

This method therefore enables the production of multi-level parts

According to further advantageous alternative embodiments of the invention:
step b) is carried out in a vacuum;
during step b), the layer of resin is heated between 70° C. and 150° C.;
the buffer has a relief imprint, at least a part of the imprint being arranged to be pressed in the vicinity of the surface of the substrate during step b).
said imprint of the buffer defines said at least a first level of the component;
the method comprises an optional step between step c) and d) which consists of locally depositing a second electrically conductive layer on the irradiated zones of the layer of resin;
the second electrically conductive layer is deposited through a stencil mask;
the second electrically conductive layer is deposited via the printing of an ink or a conductive resin;

said electrically conductive layer is of the Au, Ti, Pt, Ag, Cr, Pd type or a stack of at least two of these materials;

the substrate is made of silicon;

the substrate is made of transparent material;

the substrate made of transparent material comprises metallised zones on one of the faces thereof to form a mask;

the conductive layer has a thickness between 50 nm and 500 nm.

Finally, the invention relates to a horological component, obtained according to a method according to the invention, such as a pallet assembly or escapement wheel for example.

It is therefore understood that the method according to the invention finds a particularly advantageous application for the manufacture of components for timepieces.

BRIEF DESCRIPTION OF THE DRAWINGS

Further features and advantages of the present invention will emerge more clearly from the following detailed description of an embodiment example of a method according to the invention, this example being given merely by way of illustration and not limitation, with reference to the appended drawing wherein.

DETAILED DESCRIPTION OF A PREFERRED EMBODIMENT

The present invention relates to a method for manufacturing at least one horological component.

The first step a) consists of providing a substrate 1, and successively depositing thereon an electrically conductive layer 2, and a layer of photosensitive resin 3.

Figure 1:
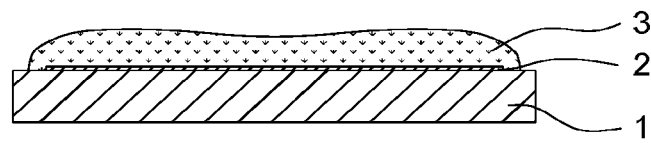
FIGS. 1 to 6 illustrate the method steps of an embodiment of the invention with a view to producing a horological component.

The substrate 1 used in step a) of the method according to the invention is, for example, formed by a silicon substrate. During the first step a) of the method, a conductive layer 2, i.e. a layer capable of starting galvanic metal deposition, is deposited, for example by physical vapour deposition (PVD). Typically, the conductive layer 2 is of the Au, Ti, Pt, Ag, Cr or Pd type (FIG. 1), or a stack of at least two of these materials, and has a thickness between 50 nm and 500 nm. For example, the conductive layer 2 can be formed of a sub-layer of chromium or titanium coated with a layer of gold or copper.

The photosensitive resin 3 used in this method is preferably an octo-functional epoxy-based negative type resin available under the reference SU-8 designed to polymerise under the action of UV radiation.

According to a specific embodiment of the invention, the resin is presented in the form of a dry film, the resin is then applied by rolling on the substrate 1.

Alternatively, the photosensitive resin could be a positive photoresist which is designed to decompose under the action of UV radiation. It will be understood that the present invention is not limited to some specific types of photosensitive resin. Those skilled in the art will know how to select a photosensitive resin suitable for their needs from all known resins which are adapted to UV photolithography.

The layer of resin 3 is deposited on the substrate 1 by any suitable means, by centrifugal coating, spin-coating, or by spraying up to the desired thickness. Typically the resin thickness is between 10 µm and 1000 µm, and preferably between 50 µm and 300 µm. According to the desired thickness and the deposition technique used, the first layer of resin 3 will be deposited in one or more passes.

The layer of resin 3 is then typically heated between 90 and 120° C. for a time dependent on the thickness deposited to remove the solvent (pre-baking step). This heating dries and hardens the resin.

Figure 2:
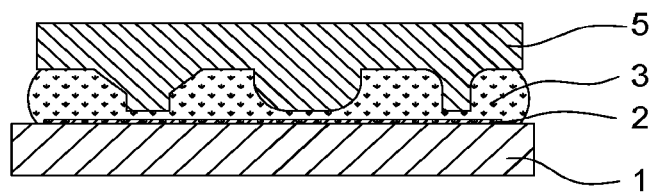

The next step b) illustrated in FIG. 2 consists of performing hot stamping of the first layer of resin 3 to shape same and define a first level of the horological component. The resin is in a first phase heated to a temperature between 70° C. and 150° C. where it becomes viscous to enable the shaping thereof by compressing same by means of a buffer 2 pressing thereon. This step is carried out in a vacuum to prevent the formation of air bubbles when pressing the layer of resin 3. According to the invention, the buffer 2 can be pressed up to a predefined distance from the substrate 1 so as to retain a layer of resin on the substrate 1.

Advantageously, the buffer 2 has a relief imprint capable of exhibiting height variations and thus making it possible to define at least a first level of the component, said at least first level thus has a complex three-dimensional geometry that cannot be obtained with a conventional LIGA method.

It can also be envisaged to form two or more levels by means of the buffer to produce the complete geometry of the component to be obtained.

Figure 3:
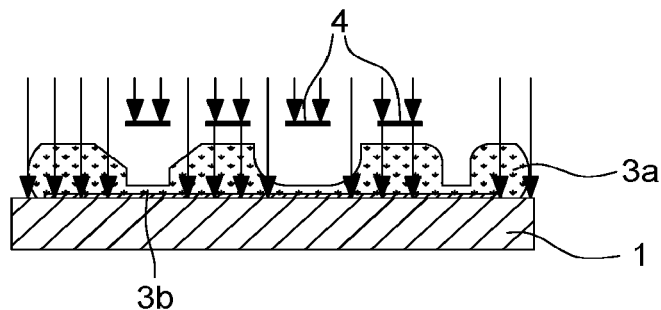

The next step c) illustrated in FIG. 3 consists of irradiating the first layer of resin 3 by means of UV radiation through a mask 4 defining the first level of the component to be formed and thus photopolymerised zones 3a and non-photopolymerised zones 3b.

An annealing step (post-baking step) of the resin layer 3 may be required to complete the photopolymerisation induced by the UV irradiation. This annealing step is performed preferably between 90° C. and 95° C. The photopolymerised zones 3a become insensitive to a large majority of solvents. On the other hand, the non-photopolymerised zones are capable of subsequently being dissolved by a solvent.

Figure 4:
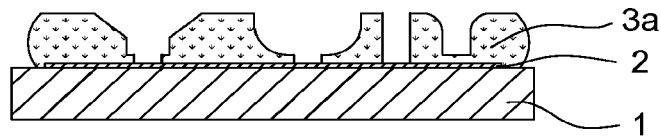

Then, the non-photopolymerised zones 3b of the layer 3 of photosensitive resin are dissolved to reveal in places the conductive layer 2 of the substrate 1 as in FIG. 4. This operation is carried out by dissolving the non-photopolymerised zones 3b by means of a suitable solvent, such as PGMEA (propylene glycol methyl ethyl acetate). A photopolymerised photosensitive resin mould 3a defining the first level and the second level of the component is thus produced.

According to an advantageous embodiment of the invention, the substrate 1 is made of a transparent material so as to be able to irradiate the resin via the rear face of the substrate.

It is possible to use a transparent substrate such as borosilicate glass (Pyrex®) or any other material withstanding heating up to 150° C. The substrate comprises a first transparent conductive layer formed by indium oxide doped with tin (indium tin oxide, ITO) and metallic patterns, for example made of a titanium and gold alloy (TiAu) in vertical alignment with the zones to be opened in the layer of resin. The layer of ITO serves to guarantee the electrical conductivity of the entire surface, thus linking the metallic patterns made of titanium and cold alloy in vertical alignment with the openings, while allowing light to pass through to the other side to polymerise the zone to be polymerised.

Figure 5:
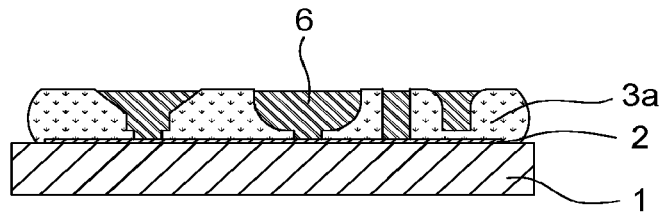

The next step d) illustrated in FIG. 5 consists of depositing in the mould, for electroforming or galvanic deposition, a layer 6 of a metal from the electrically conductive layer 2 until a block is formed preferentially attaining a height less than the height of the mould, enabling superior mechanical strength during subsequent machining. The term metal in this context obviously includes metal alloys. Typically, the metal will be selected from the set comprising nickel, copper, gold or silver, and, by way of alloy, gold-copper, nickel-cobalt, nickel-iron, nickel-phosphorus, or indeed nickel-tungsten. As a general rule, the multi-layer metallic structure is entirely made of the same alloy or metal. However, it is also possible to change metal or alloy during the galvanic deposition step so as to obtain a metallic structure including at least two layers of different types.

The electroforming conditions, particularly the bath compositions, the geometry of the system, the voltages and current densities, are selected for each metal or alloy to be electrodeposited according to well-known techniques in the art of electroforming.

The metallic layer 6 can be machined using a mechanical method so as to obtain a thickness predefined by the thickness of the component to be produced.

According to an optional step carried out between step c) and d), a second conductive layer is deposited locally on certain photopolymerised zones 3a shaped by the hot stamping. This second conductive layer can have the same characteristics as the first conductive layer 2.

According to a first alternative embodiment, a stencil mask which is positioned via an optical alignment is used. Such equipment makes it possible to guarantee proper alignment of the mask with the geometry of the photopolymerised zones 3a on the substrate and thus guarantee a deposition only on the top surface of the selected photopolymerised zones 3a as the mask is kept as close as possible to the substrate 1.

According to a further alternative embodiment, the second electrically conductive layer is implemented by 3D printing to deposit the second conductive layer.

Such solutions enable a selective and more precise deposition of the second electrically conductive layer, and therefore help better control the galvanic growth during step d).

Figure 6:
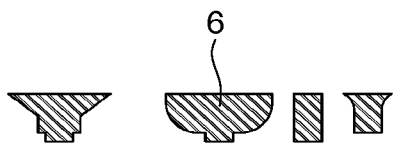

Step e), illustrated in FIG. 6, consists of releasing the component by removing with a succession of wet or dry etching steps, the substrate, the conductive layers or the layers of resin, familiar operations for those skilled in the art. For example, the first conductive layer 2 and the substrate 1 are removed by means of wet etching, which makes it possible to release the component from the substrate 1 without damaging it. Obviously, the silicon substrate can be etched with a solution based on potassium hydroxide (KOH).

Following this first sequence, a component set in the layer of resin is obtained, the conductive layer 2 still being present in places.

A second sequence consists of removing the layer of resin 3 by means of $O_2$ plasma etching operations, interspersed with wet etching operations of the intermediate metallic layers.

Following this step, the components obtained can be cleaned, and optionally reworked on a machine tool to perform machining operations or cosmetic finishing. At this stage, the parts can be used directly or undergo various decorative and/or functional treatments, typically physical or chemical depositions.

The method according to the invention finds a particularly advantageous application for the manufacture of components for timepieces, such as springs, pallet assemblies, wheels, appliques, etc. Thanks to this method, it is possible to produce components of more diverse shapes and having more complex geometries than those obtained via conventional photolithography operations. Such a method also makes it possible to obtain robust components, which show good reliability in terms of geometries.

The invention claimed is:

1. A method for manufacturing at least one horological component comprising the following steps:
    a) providing a substrate, depositing a first electrically conductive layer thereon, and applying a layer of photosensitive resin;
    b) performing hot stamping via a buffer of the layer of photosensitive resin by pressing the buffer up to a predefined distance from the substrate to form a shaped layer of photosensitive resin;
    c) irradiating the shaped layer of photosensitive resin through a mask defining at least a first level of the component and dissolving non-irradiated zones of the shaped layer of photosensitive resin to reveal in places the first electrically conductive layer and form a mould comprising a first and a second level;
    d) depositing a metallic layer by electroforming in the mould from the first electrically conductive layer to form the component, the metallic layer substantially reaching a top surface of the shaped layer of photosensitive resin; and
    e) successively removing the substrate, the first electrically conductive layer and the shaped layer of photosensitive resin to release the component.

2. The method according to claim 1, wherein step b) is carried out in a vacuum.

3. The method according to claim 1, wherein during step b), the layer of photosensitive resin is heated between 70'C and 150'C.

4. The method according to claim 1, wherein the buffer has a relief imprint, at least a part of the imprint being arranged to be pressed in a vicinity of the surface of the substrate during step b).

5. The method according to claim 4, wherein said imprint of the buffer defines said at least a first level of the component.

6. The method according to claim 1, further comprising a step between step c) and d) of locally depositing a second electrically conductive layer on the irradiated zones.

7. The method according to claim 6, wherein the second electrically conductive layer is deposited through a stencil mask.

8. The method according to claim 6, wherein the second electrically conductive layer is deposited via printing of an ink or a conductive resin.

9. The method according to claim 1, wherein the first electrically conductive layer comprises Au, Ti, Pt, Ag, Cr, or Pd.

10. The method according to claim 1, wherein the substrate is made of silicon.

11. The method according to claim 1, wherein the substrate is made of transparent material.

12. The method according to claim 11, wherein the substrate made of transparent material comprises a transparent conductive layer and metallised zones on a face thereof to form a mask.

13. The method according to claim 1, wherein the first electrically conductive layer has a thickness between 50 nm and 500 nm.

14. A horological component made according to a method according to claim 1.

* * * * *